(12) United States Patent
Doris et al.

(10) Patent No.: US 9,536,986 B2
(45) Date of Patent: Jan. 3, 2017

(54) ENRICHED, HIGH MOBILITY STRAINED FIN HAVING BOTTOM DIELECTRIC ISOLATION

(71) Applicant: INTERNATIONAL BUSINESS MACHINES CORPORATION, Armonk, NY (US)

(72) Inventors: Bruce B. Doris, Slingerlands, NY (US); Hong He, Schenectady, NY (US); Juntao Li, Cohoes, NY (US); Junli Wang, Slingerlands, NY (US); Chih-Chao Yang, Glenmont, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 14/743,504

(22) Filed: Jun. 18, 2015

(65) Prior Publication Data

US 2016/0190288 A1    Jun. 30, 2016

Related U.S. Application Data

(63) Continuation of application No. 14/585,572, filed on Dec. 30, 2014.

(51) Int. Cl.
*H01L 21/336* (2006.01)
*H01L 29/66* (2006.01)
*H01L 29/78* (2006.01)
*H01L 29/06* (2006.01)

(52) U.S. Cl.
CPC ..... *H01L 29/66795* (2013.01); *H01L 29/0653* (2013.01); *H01L 29/785* (2013.01); *H01L 29/7843* (2013.01); *H01L 29/7849* (2013.01)

(58) Field of Classification Search
CPC .................................. H01L 29/66795
USPC ........................................ 438/283
See application file for complete search history.

(56) References Cited

U.S. PATENT DOCUMENTS 6,642,090 B1 * 11/2003 Fried ............... H01L 21/823828
257/E21.635

OTHER PUBLICATIONS

List of IBM Patents or Patent Applications Treated as Related—Date Filed: Aug. 3, 2015; 2 page.
Bruce Doris, "Enriched, High Mobility Strained Fin Having Bottom Dielectric Isolation," U.S. Appl. No. 14/585,572, filed Dec. 30, 2014.

* cited by examiner

*Primary Examiner* — Anthony Ho
(74) *Attorney, Agent, or Firm* — Cantor Colburn LLP; Vazken Alexanian

(57) ABSTRACT

Embodiments are directed to a method of enriching and electrically isolating a fin of a FinFET. The method includes forming at least one fin. The method further includes forming under a first set of conditions an enriched upper portion of the at least one fin. The method further includes forming under a second set of conditions an electrically isolated region from a lower portion of the at least one fin, wherein forming under the first set of conditions is spaced in time from forming under the second set of conditions. The method further includes controlling the first set of conditions separately from the second set of conditions.

13 Claims, 6 Drawing Sheets

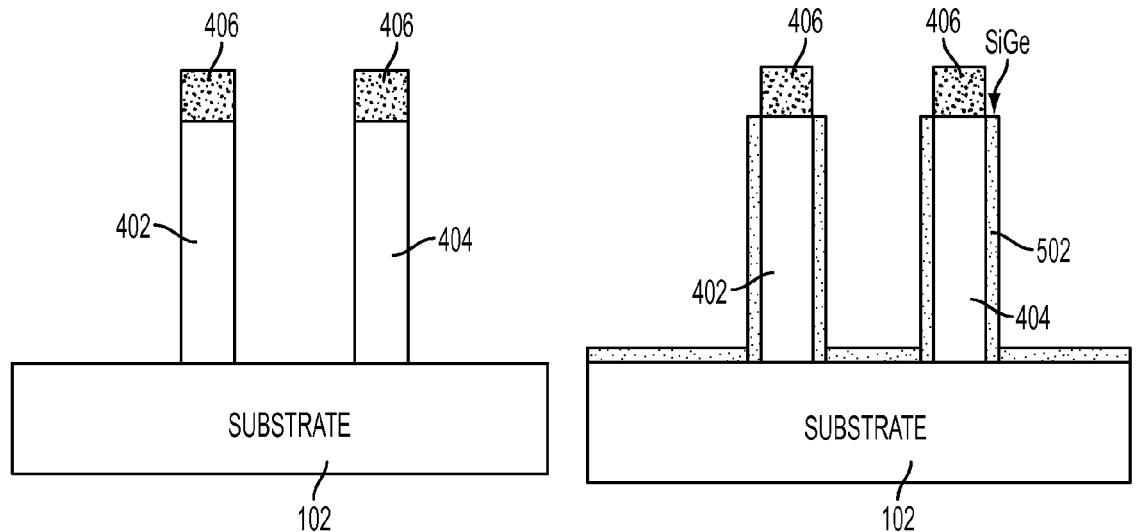
FIG. 4
FIG. 5
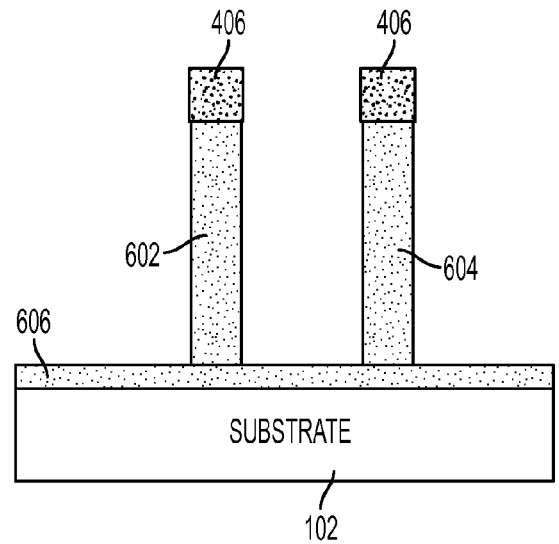
FIG. 6

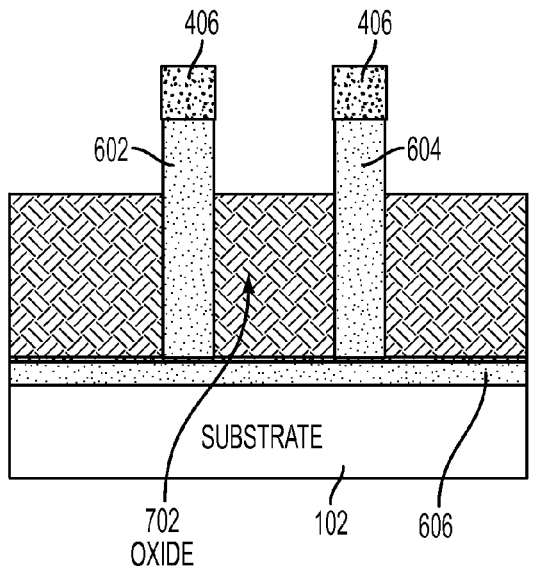
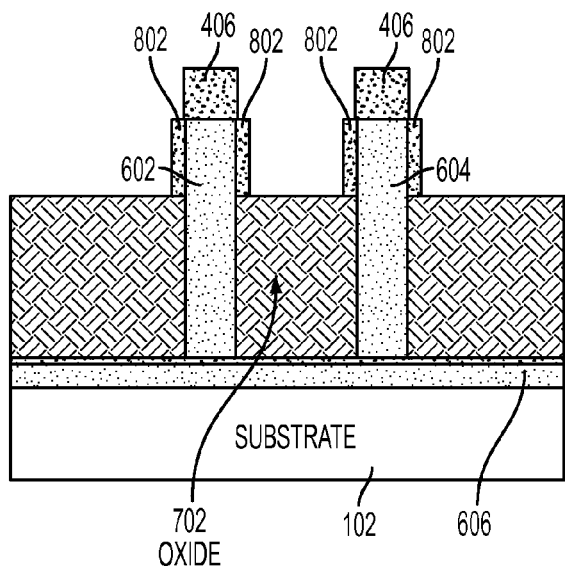
FIG. 7
FIG. 8
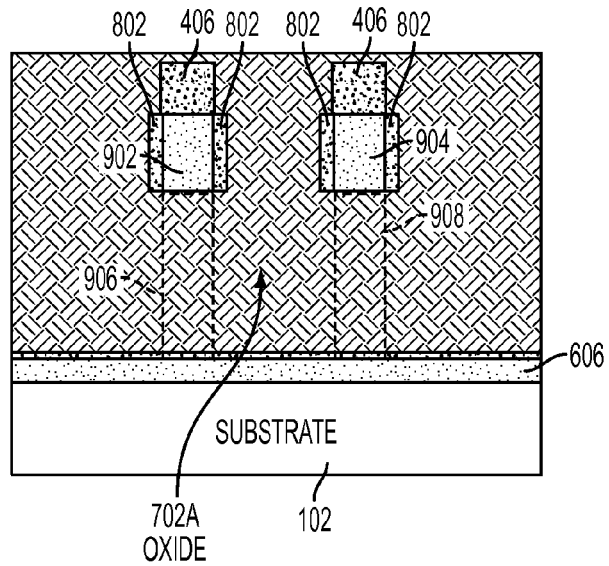
FIG. 9

ENRICHED, HIGH MOBILITY STRAINED FIN HAVING BOTTOM DIELECTRIC ISOLATION

DOMESTIC PRIORITY

The present application claims priority to U.S. Nonprovisional application Ser. No. 14/585,572 filed on Dec. 30, 2014 titled "ENRICHED, HIGH MOBILITY STRAINED FIN HAVING BOTTOM DIELECTRIC ISOLATION", assigned to the assignee hereof and expressly incorporated by reference herein.

BACKGROUND

The present disclosure relates in general to semiconductor devices and their manufacture, and more specifically to the formation of an enriched, high mobility strained SiGe fin having bottom dielectric isolation.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

One particularly advantageous type of MOSFET is known generally as a fin-type field effect transistor (FinFET). The basic electrical layout and the mode of operation of a FinFET does not differ from a traditional field effect transistor. There is one source and one drain contact, as well as a gate to control the source to drain current flow. In contrast to planar MOSFETs, however, the source, drain and channel are built as a three-dimensional bar on top of the semiconductor substrate. The three-dimensional bar is known generally as a "fin," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor.

The use of silicon germanium in semiconductor devices provides desirable device characteristics, including the introduction of strain at the interface between the silicon germanium of the active device and the underlying semiconductor substrate. In general, a strained semiconductor's atoms are stretched beyond their normal inter-atomic distances. As the atoms in the silicon align with the atoms of the silicon germanium (which are arranged a little farther apart, with respect to those of a bulk silicon crystal), the links between the silicon germanium atoms become stretched, thereby leading to strained silicon germanium. Moving atoms farther apart reduces the atomic forces that interfere with the movement of electrons through the silicon germanium, which results in better mobility, better chip performance and lower energy consumption. The faster moving electrons in strained silicon germanium allow faster switching in transistors having strained silicon germanium channel regions.

The strain introduced by using silicon germanium in the active region of a semiconductor device is increased as the concentration of germanium in the silicon germanium increases. However, after growing silicon germanium to a certain level of thickness, defects begin to form, and these defects are proportional to the concentration of germanium in the silicon germanium. Thus, there is generally an inverse relationship between the concentration of germanium in the silicon germanium layer and the thickness to which the silicon germanium layer can be grown without introducing defects.

SUMMARY

Embodiments are directed to a method of enriching and electrically isolating a fin of a FinFET. The method includes forming at least one fin. The method further includes forming under a first set of conditions an enriched upper portion of the at least one fin. The method further includes forming under a second set of conditions an electrically isolated region from a lower portion of the at least one fin, wherein forming under the first set of conditions is spaced in time from forming under the second set of conditions. The method further includes controlling the first set of conditions separately from the second set of conditions.

Embodiments are further directed to an enriched and electrically isolated fin of a FinFET. The fin includes an enriched upper portion having been formed under a first set of conditions. The fin further includes an electrically isolated region having been formed under a second set of conditions, wherein the first set of conditions were spaced in time from the second set of conditions, and wherein the first set of conditions were controlled separately from the second set of conditions.

Additional features and advantages are realized through techniques described herein. Other embodiments and aspects are described in detail herein. For a better understanding, refer to the description and to the drawings.

BRIEF DESCRIPTION OF THE SEVERAL VIEWS OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIG. 4 depicts a cross-sectional view of another intermediate fabrication stage for a semiconductor device according to one or more embodiments;

FIG. 5 depicts a cross-sectional view of another intermediate fabrication stage for a semiconductor device according to one or more embodiments;

FIG. 6 depicts a cross-sectional view of another intermediate fabrication stage for a semiconductor device according to one or more embodiments;

FIG. 7 depicts a cross-sectional view of another intermediate fabrication stage for a semiconductor device according to one or more embodiments;

FIG. 8 depicts a cross-sectional view of another intermediate fabrication stage for a semiconductor device according to one or more embodiments;

FIG. 9 depicts a cross-sectional view of another intermediate fabrication stage for a semiconductor device according to one or more embodiments;

DETAILED DESCRIPTION

Figure 1:
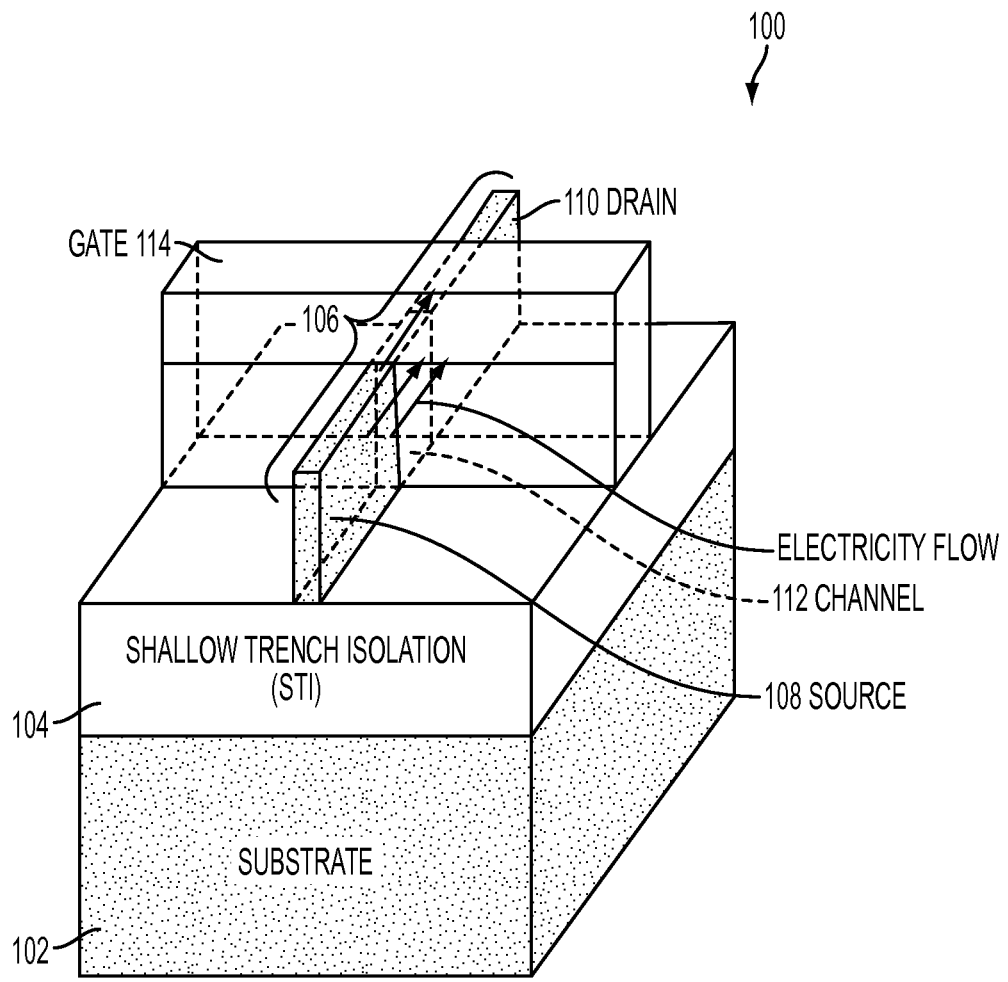
FIG. 1 is a three-dimensional view of a high mobility, strained FinFET that incorporates an enriched fin structure and bottom dielectric fabrication methodology in accordance with one or more embodiments.

It is understood in advance that although this disclosure includes a detailed description of a p-type FET or FinFET device having silicon germanium fins, implementation of the teachings recited herein are not limited to a particular p-type FET or FinFET structure. Rather, embodiments of the present disclosure are capable of being implemented in conjunction with any other type of fin-based transistor device now known or later developed.

As previously noted herein, the use of silicon germanium in semiconductor devices provides desirable device characteristics, including the introduction of strain at the interface between the silicon germanium of the active device and the underlying silicon substrate. In general, a strained semiconductor's atoms are stretched beyond their normal interatomic distances. As the atoms in the silicon align with the atoms of the silicon germanium (which are arranged a little farther apart, with respect to those of a bulk silicon crystal), the links between the silicon germanium atoms become stretched, thereby leading to strained silicon germanium. Moving atoms farther apart reduces the atomic forces that interfere with the movement of electrons through the silicon germanium, which results in better mobility, better chip performance and lower energy consumption. The faster moving electrons in strained silicon germanium allow for faster switching in transistors having strained silicon germanium channel regions.

A fin structure and fabrication methodology for an enriched, high mobility, strained fin for use in a FinFET device that incorporates an insulating layer under the fin are disclosed in a co-pending, commonly assigned U.S. patent application entitled "FINFET FORMED OVER DIELECTRIC," filed on Aug. 21, 2013 and bearing application Ser. No. 13/972,032, the entire disclosure of which is incorporated herein by reference in its entirety. The fabrication methodology of the above-referenced, co-pending patent application uses a thermal oxidation to diffuse germanium into an upper portion of a silicon fin, thereby enriching the upper portion of the silicon fin with germanium to form an enriched upper fin portion of silicon germanium. Concurrently, the same thermal oxidation also oxidizes a lower portion of the silicon fin to form a dielectric under the enriched upper portion of the fin. By diffusing germanium into the silicon fin to form the silicon germanium fin, the inverse relationship between the concentration of germanium in the silicon germanium layer and the thickness to which the silicon germanium layer can be grown without introducing defects may be avoided.

One or more embodiments of the present disclosure provide a fin structure and fabrication methodology that allow precise control over the formation of an enriched, electrically isolated, strained high mobility fin element of a FinFET device. The formation of an enriched upper portion of the fin is sufficiently separated in time from the formation of an electrically isolated region of the fin to allow the formation of the enriched upper portion to be controlled separately from the formation of the electrically isolated region. Accordingly, a first set of conditions under which the enriched upper portion of the fin is formed may be selected to optimize the formation of the enriched upper portion. Preferably, the first set of conditions includes one or more of a temperature or a duration or other parameters. Similarly, the second set of conditions under which the electrically isolated region of the fin is formed may be selected to optimize the formation of the electrically isolated region. Preferably, the second set of conditions includes one or more of a temperature or a duration or other parameters. An example of how of the first set of conditions may be controlled separately from the second set of conditions is performing multiple iterations of the enrichment process on a non-enriched upper portion of the fin until desired parameters for the enriched upper portion are achieved without introducing defects. Spacers are utilized selectively during fabrication to maintain the heights of the upper portions of the enriched fins.

In accordance with one or more embodiments, FIG. 1 illustrates a three-dimensional view of a high mobility, strained FinFET 100 that incorporates an enriched fin structure and bottom dielectric fabrication methodology in accordance with the present disclosure. FinFET 100 includes a semiconductor substrate 102, a shallow trench isolation (STI) layer 104, an enriched fin 106 and a gate 114, configured and arranged as shown. Enriched fin 106 includes a source region 108, a drain region 110 and a channel region 112, wherein gate 114 extends over the top and sides of channel region 112. Preferably, substrate 102 is silicon, STI 104 is an oxide (e.g., $SiO_2$) and fin 106 is silicon that has been enriched to a desired concentration level of germanium.

Figure 2:
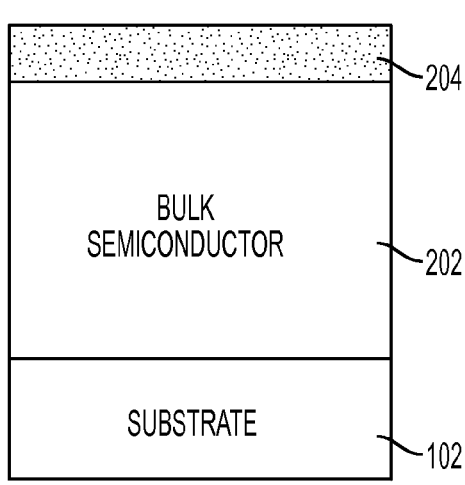
FIG. 2 depicts a cross-sectional view of an initial fabrication stage for a semiconductor device according to one or more embodiments.
Figure 3:
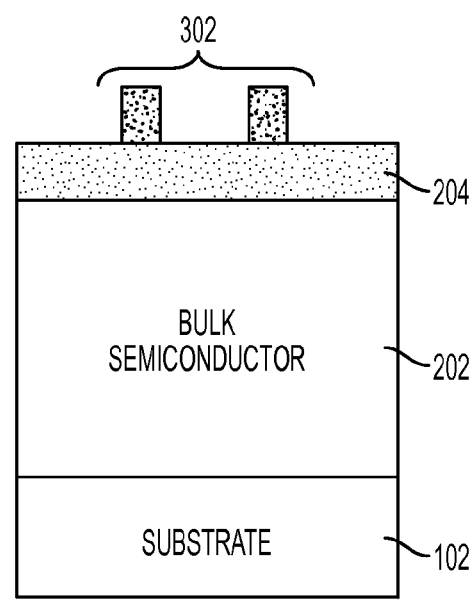
FIG. 3 depicts a cross-sectional view of an intermediate fabrication stage for a semiconductor device according to one or more embodiments.

A fabrication methodology for forming semiconductor substrate 102, STI layer 104 and enriched fin 106 of FinFET 100 (all shown in FIG. 1) will now be described with reference to various fabrication stages shown in FIGS. 2-10. Referring now to FIG. 2, an initial structure is formed having semiconductor substrate 102, a bulk semiconductor material 202 and a hard mask layer 204, configured and arranged as shown. Semiconductor substrate 102 and bulk semiconductor material 202 may be formed from the same material. Hard mask layer 202 may be a silicon nitride material (e.g., $Si_3Ni_4$). In FIG. 3, a patterned resist 302 is added over hard mask layer 204 to pattern and form non-enriched fins 402, 404 (shown in FIG. 4) from bulk semiconductor 202. Non-enriched fins 402, 404 may be formed by applying an anisotropic etch process, which results in the structure shown in FIG. 4. Because there is no stop layer on semiconductor substrate 102, the etch process is time based. For example, in a 22 nanometer deep process the width of the fins could be 10 to 15 nanometers, and the height of the fins would ideally be twice that or more.

In FIG. 5, a semiconductor layer 502 is conformally formed over the sidewalls of non-enriched fins 402, 404 and the top of substrate 102. A conformal coating is a protective chemical coating or polymer film conforms to the circuit board topology. Semiconductor layer 502 may be a germanium containing layer, such as, for example, a high concentration germanium or silicon germanium layer, or any other germanium containing layer having a thickness of about 20 to 30 nanometers.

FIG. 6 shows the result of a first high temperature thermal oxidation performed on the device structure shown in FIG. 5. The first high temperature thermal oxidation is performed at a temperature of about 800 to about 1200 degrees Celsius, for example. As a result of the first high temperature thermal oxidation, germanium from the germanium containing layer 502 in contact with non-enriched fins 402, 404 and substrate 102 diffuses into non-enriched fins 402, 404 and substrate 102 to form germanium enriched silicon fins 602, 604 and germanium enriched substrate layer 606. Multiple iterations of the first high temperature thermal oxidation may be performed until at least one of the following is reached: a selected concentration of germanium in enriched fins 602, 604; a selected electron mobility of enriched fins 602, 604; a selected switching speed of enriched fins 602, 604; and a selected level of strain of enriched fins 602, 604.

In FIG. 7, an oxide 702 (e.g., $SiO_2$) is deposited between enriched fins 602, 604 and over enriched layer 606 of substrate 102. Oxide 702 is polished and recessed back to expose upper portions of enriched fins 602, 604. The Polishing operation referred here removes oxide selectively with respect to the hard mask, and the oxide can then be recessed selectively compared to the hard mask by reactive ion etching (RIE). In FIG. 8, spacers 802 are formed along the sides of the upper portions of enriched fins 602, 604. Spacers 802 are formed, for example, from a silicon nitride (e.g., $Si_3N_4$) and protect the exposed sides and maintain the heights of the upper portions of enriched fins 602, 604 during fabrication. The tops of the upper portions of enriched fins 602, 604 are still protected by hard masks 406, which were used in an earlier formation operation to form non-enriched fins 402, 404 (shown in FIG. 4).

In FIG. 9, additional oxide 702A (e.g., $SiO_2$) is deposited to raise a height of oxide 702A over hard masks 406. A chemical/mechanical polish is applied to oxide 702A to planarize oxide 702A down to the tops of hard masks 406. A second high temperature thermal oxidation is performed, which results in the device structure shown in FIG. 9. The second high temperature thermal oxidation is performed at temperature of about 800 to about 1200 degrees Celsius, for example. As a result of the second high temperature thermal oxidation, lower portions of enriched fins 602, 604 oxidize to form electrically isolated lower portions 906, 908. Concurrently, upper enriched portions 902, 904 are formed. Thus, electrically isolated lower portions 906, 908 provide dielectric isolation underneath enriched upper portions 902, 904, respectively. In effect, electrically isolated lower portions 906, 908 and oxide 702A now work together to provide electrical isolation.

Figure 10:
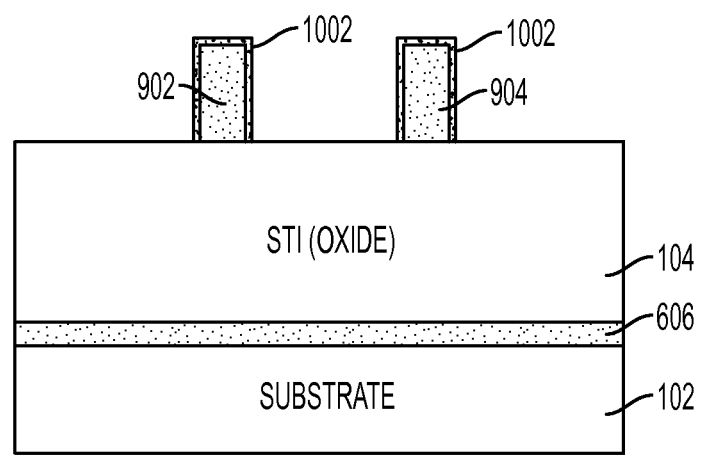
FIG. 10 depicts a cross-sectional view of a final fabrication stage for a semiconductor device according to one or more embodiments.

In FIG. 10, oxide 702A is again recessed and polished using a polishing operation to selectively remove oxide, and an RIE operation to selectively recess the oxide. This chemical mechanical polish (CMP) operation forms STI 104 and exposes enriched upper portions 902, 904. Spacers 802 and hard masks 406 are removed. STI region 104 is preferably recessed to a depth of about 30 nanometers from the stop surfaces of enriched upper portions 902, 904. However, other depths may also be employed in accordance with a desired fin height for later processing steps. A thin insulating layer 1002 is formed over the regions of enriched upper portions 902, 904 that will become channel region 112 (shown in FIG. 1). The resulting enriched, electrically isolated, strained high mobility fin element is shown in FIG. 10. FinFET structure 100 of FIG. 1 is formed with the addition of gate electrode 114 over the regions of enriched upper portions 902, 904 that will become channel region 112. For ease of illustration, only one fin 106 is shown in FinFET 100.

Figure 11:
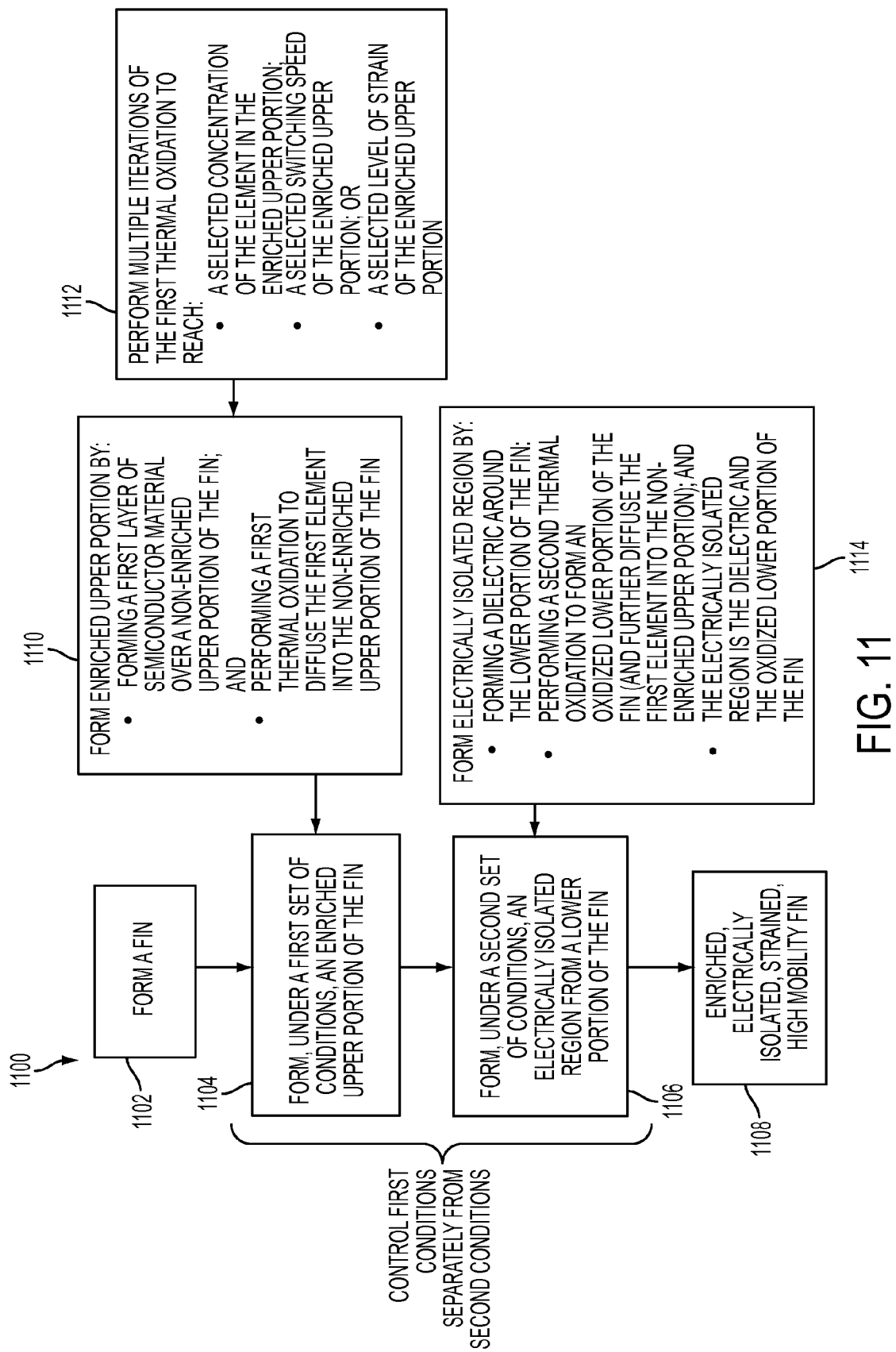
FIG. 11 is a flow diagram illustrating a methodology according to one or more embodiments.

FIG. 11 is a flow diagram illustrating a methodology 1100 for forming an enriched, electrically isolated, strained, high mobility fin of a FinFET device in accordance with one or more embodiments. Methodology 1100 begins at block 1102 with the formation of a fin using conventional semiconductor fabrication techniques. An example of the fin formation of block 1102 are the device processing steps shown in FIGS. 2 and 3, which result in the fins shown in FIG. 4. At block 1104, an enriched upper portion of the fin is formed under a first set of conditions. At block 1106, an electrically isolated region is formed from a lower portion of the fin under a second set of conditions. At block 1108, a resulting enriched, electrically isolated, strained, high mobility fin is generated. Preferably, as identified in FIG. 11, the first set of conditions is controlled separately from the second set of conditions. Preferably, the separate control is accomplished by separating the formation of the enriched upper portion in time from the formation of the electrically isolated region such that the first set of conditions may be controlled separately from the second set of conditions. Accordingly, the first set of conditions may be selected to optimize the formation of the enriched upper portion, and the second set of conditions may be selected to optimize the formation of the electrically isolated lower region. Preferably, the first set of conditions and the second set of conditions include one or more of a temperature or a duration or other parameters.

Block 1110 provides additional detail of how the enriched upper portion of block 1108 may be formed. As shown at block 1110, the enriched upper portion may be formed by: forming a first layer of semiconductor material over a non-enriched upper portion of the fin; and performing a first thermal oxidation to diffuse the first element into the non-enriched upper portion of the fin. Preferably, the non-enriched upper portion of the fin is made from silicon, the first layer of semiconductor material is made from silicon germanium and the first element is germanium. The first thermal oxidation diffuses germanium from the silicon germanium first layer into the silicon non-enriched upper portion, thereby influencing several properties of the upper portion of the fin, including, for example, the upper portion's strain and electron mobility. In general, a strained semiconductor's atoms are stretched beyond their normal interatomic distances. This can be accomplished by interfacing silicon germanium with silicon. As the atoms in the silicon align with the atoms of the silicon germanium (which are arranged a little farther apart, with respect to those of a bulk silicon crystal), the links between the silicon germanium atoms become stretched, thereby leading to strained silicon germanium. Moving atoms farther apart reduces the atomic forces that interfere with the movement of electrons through the silicon germanium, which results in better mobility, better chip performance and lower energy consumption. The faster moving electrons in strained silicon germanium allow faster switching in transistors having channel regions formed from strained silicon germanium.

As previously noted, separating the formation of the enriched upper portion (block 1104) in time from the formation of the electrically isolated region (1106) allows the first set of conditions to be controlled separately from the second set of conditions. Accordingly, the first set of conditions may be selected to optimize the formation of the enriched upper portion. Preferably, the first set of conditions includes one or more of a temperature or a duration or other parameters. Block 1112 provides an example of how of the first set of conditions may be controlled separately from the second set of conditions. In block 1112, multiple iterations of the first thermal oxidation may be performed until desired parameters for the enriched upper portion are achieved, including, but not limited to, a selected concentration of the element in the enriched upper portion, a selected switching speed of the enriched upper portion, a selected level of strain of the enriched upper portion, and other parameters.

Block 1114 provides additional detail of how the electrically isolated region may be formed from a lower portion of the fin. As shown at block 1114, the electrically isolated region may be formed by: forming a dielectric around the lower portion of the fin; and performing a second thermal oxidation to form an oxidized lower portion of the fin. The second thermal oxidation may even further diffuse the first element into the non-enriched upper portion of the fin. The electrically isolated region is the dielectric and the oxidized lower portion of the fin. Similar to the first set of conditions, the second set of conditions under which blocks 1106, 1114 form the electrically isolated region may be selected to optimize the formation of the electrically isolated region from the lower portion of the fin. Preferably, the first set of conditions includes one or more of a temperature or a duration or other parameters.

Thus, it can be seen from the forgoing detailed description and accompanying illustrations that embodiments of the present disclosure provide structures and methodologies for controlling the formation of enriched, electrically isolated, strained high mobility fin elements of a FinFET. The formation of an enriched upper portion of the fin is sufficiently separated in time from the formation of an electrically isolated region of the fin to allow the formation of the enriched upper portion to be controlled separately from the formation of the electrically isolated region. Accordingly, a first set of conditions under which the enriched upper portion of the fin is formed may be selected to optimize the formation of the enriched upper portion. Preferably, the first set of conditions includes one or more of a temperature or a duration or other parameters. Similarly, a second set of conditions under which the electrically isolated region is formed may be selected to optimize the formation of the electrically isolated region. Preferably, the second set of conditions includes one or more of a temperature or a duration or other parameters. An example of how of the first set of conditions may be controlled separately from the second set of conditions is performing multiple iterations of the enrichment process on a non-enriched upper portion of the fin until desired parameters for the enriched upper portion are achieved without introducing defects. Spacers are utilized selectively during fabrication to maintain the heights of the upper portions of the enriched fins.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming and electrically isolating a fin of a fin-type field effect transistor (FinFET), the method comprising:
    forming at least one fin from a semiconductor material;
    forming, under a first set of conditions, an upper portion of said at least one fin by inserting at least one element into said upper portion of said at least one fin;
    forming, under a second set of conditions, an electrically isolated region from a lower portion of said at least one fin;
    wherein said forming under said first set of conditions is spaced in time from said forming under said second set of conditions; and
    controlling said first set of conditions separately from said second set of conditions; wherein said controlling said first set of conditions comprises controlling a first temperature.

2. The method of claim 1 wherein said inserting at least one element into said upper portion comprises:
    forming a first layer of a semiconductor material over said upper portion of said at least one fin, wherein said semiconductor material comprises said at least one element; and
    performing a first thermal oxidation to diffuse said at least one element of said first layer into said upper portion of said at least one fin.

3. The method of claim 2, wherein said controlling said first set of conditions comprises performing multiple iterations of said performing said first thermal oxidation to reach a selected concentration of said at least one element in said upper portion of said at least one fin.

4. The method of claim 2, wherein said controlling said first set of conditions comprises performing multiple iterations of said performing said first thermal oxidation to reach a selected electron mobility of said upper portion of said at least one fin.

5. The method of claim 2, wherein said controlling said first set of conditions comprises performing multiple iterations of said performing said first thermal oxidation to reach a selected switching speed of said upper portion of said at least one fin.

6. The method of claim 2, wherein said controlling said first set of conditions comprises performing multiple iterations of said performing said first thermal oxidation to reach a selected level of strain of said upper portion of said at least one fin.

7. The method of claim 2 wherein said forming under said second set of conditions said electrically isolated region comprises:
   forming a dielectric around said lower portion of said at least one fin; and
   performing a second thermal oxidation to form an oxidized lower portion of said at least one fin;
   wherein said electrically isolated region comprises said oxidized lower portion;
   wherein said dielectric and said electrically isolated region electrically isolate said upper portion of said at least one fin.

8. The method of claim 7, wherein said second thermal oxidation further diffuses said at least one element of said first layer into said upper portion of said at least one fin.

9. The method of claim 2, wherein said first layer of semiconductor material comprises silicon germanium.

10. The method of claim 2 wherein said at least one element of said first layer comprises germanium.

11. The method of claim 1 wherein said controlling said first set of conditions further comprises controlling a first duration.

12. The method of claim 11 wherein said controlling said second set of conditions comprises controlling a second duration that is different from said first duration.

13. The method of claim 1 wherein controlling said second set of conditions comprises controlling a second temperature that is different from said first temperature.

* * * * *